(12) United States Patent
Zhou et al.

(10) Patent No.: US 8,564,732 B2
(45) Date of Patent: Oct. 22, 2013

(54) BACK COVER OF LCD, BACKLIGHT MODULE AND LCD

(75) Inventors: Gege Zhou, Shenzhen (CN); Yuchun Hsiao, Shenzhen (CN); Pangling Zhang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 125 days.

(21) Appl. No.: 13/377,549

(22) PCT Filed: Sep. 20, 2011

(86) PCT No.: PCT/CN2011/079867
§ 371 (c)(1),
(2), (4) Date: Dec. 10, 2011

(87) PCT Pub. No.: WO2013/013442
PCT Pub. Date: Jan. 31, 2013

(65) Prior Publication Data
US 2013/0027628 A1    Jan. 31, 2013

(30) Foreign Application Priority Data
Jul. 26, 2011    (CN) .................... 2011 2 0267073 U

(51) Int. Cl.
*G02F 1/1333*    (2006.01)
*G02F 1/1335*    (2006.01)
*G09F 13/04*    (2006.01)

(52) U.S. Cl.
USPC ........................... 349/58; 349/61; 362/97.2

(58) Field of Classification Search
USPC ..................... 349/58, 61; 362/97.2
See application file for complete search history.

(56) References Cited

U.S. PATENT DOCUMENTS

| | | | | |
|---|---|---|---|---|
| 6,827,461 B2* | 12/2004 | Kao | ............................... | 362/633 |
| 7,301,588 B2* | 11/2007 | Ogawa | ............................. | 349/58 |
| 7,415,688 B2* | 8/2008 | Sakakibara | ................... | 716/126 |
| 7,819,574 B2* | 10/2010 | Yoo et al. | ...................... | 362/633 |
| 8,054,406 B2* | 11/2011 | Cheng | ............................. | 349/65 |
| 2007/0081356 A1* | 4/2007 | Lee et al. | ..................... | 362/561 |

* cited by examiner

*Primary Examiner* — Mike Qi

(57) ABSTRACT

A back cover of a liquid crystal display (LCD) for supporting a backlight module is disclosed. The back cover comprises a back cover body and an inset. The inset is inset into the back cover body and is of a hollow frame structure, and the inset is a sheet metal inset, a ceramic inset or a heat pipe inset. A backlight module supported by the back cover and an LCD comprising the backlight module and the back cover are also disclosed. According to the back cover of an LCD, the backlight module supported by the back cover and the LCD comprising the backlight module, the back cover is formed of a plastic material through injection molding, so it is simple to fabricate and can reduce the material cost.

15 Claims, 3 Drawing Sheets

BACK COVER OF LCD, BACKLIGHT MODULE AND LCD

BACKGROUND

1. Technical Field

The present disclosure relates to the technical field of liquid crystal displaying, and more particularly, to a back cover of a liquid crystal display (LCD), a backlight module and an LCD.

2. Description of Related Art

As a kind of flat panel display devices that utilize liquid crystals to display images, liquid crystal displays (LCDs) are lighter and thinner and requires a lower driving voltage and lower power consumption as compared to other kinds of display devices. Therefore, LCDs have found wide application in various industries. However, LCD panels cannot emit light by themselves, so they must be provided with a backlight source capable of independently providing light.

Generally, a back cover is used in an LCD to support the whole backlight module so that all components of the backlight module can be securely fixed. This requires that the back cover has a high strength and high flatness in order to ensure the flatness of and compatibility between key parts of the backlight module. Furthermore, the back cover shall also have a heat dissipation function because, if heat generated by the backlight source of the backlight module is not dissipated outwards timely, the light emission efficiency of the backlight source would be degraded.

Commonly, the back cover is made of a whole piece of sheet metal by use of sheet-metal stamping dies. However, the sheet metal materials are relatively costly, and because fabrication of the stamping dies represents great difficulty, it is difficult to ensure quality of the finished products.

BRIEF SUMMARY

A primary objective of the present disclosure is to provide a back cover of a liquid crystal display (LCD), a backlight module supported by the back cover, and an LCD comprising the backlight module. The back cover is formed of a plastic material through injection molding, so it is simple to fabricate and can reduce the material cost.

The present disclosure provides a back cover of a liquid crystal display (LCD) for supporting a backlight module, wherein the back cover comprises a back cover body and an inset. The inset is inset into the back cover body and is of a hollow frame structure, and the inset is a sheet metal inset, a ceramic inset or a heat pipe inset.

Preferably, the inset is of an H-shaped or dentation structure.

Preferably, the inset is fixedly covered by the back cover body.

Preferably, the inset is fixed to the back cover body through adhesion or by means of screws.

Preferably, the back cover further comprises a thermally conductive element fixed at a side of the back cover body.

The present disclosure further provides a backlight module supported by a back cover. The back cover comprises a back cover body and an inset. The inset is inset into the back cover body and is of a hollow frame structure, and the inset is a sheet metal inset, a ceramic inset or a heat pipe inset.

The present disclosure further provides an LCD, comprising a backlight module and a back cover for supporting the backlight module. The back cover comprises a back cover body and an inset. The inset is inset into the back cover body and is of a hollow frame structure, and the inset is a sheet metal inset, a ceramic inset or a heat pipe inset.

According to the present disclosure, the back cover is formed of a plastic material through injection molding or compression molding. Specifically, the inset is put into a mold for the back cover body in advance, and then the back cover is injection molded in such a way that the back cover is joined with the inset securely. Thus, the back cover is simple to fabricate and has a low material cost. Particularly, the inset made of a metal, a ceramic or a heat pipe can not only impart a desirable strength and desirable flatness to the back cover, but also have superior thermal conductivity adapted to dissipate heat generated by the backlight module timely.

Hereinafter, implementations, functional features and advantages of the present disclosure will be further described with reference to embodiments thereof and the attached drawings.

DETAILED DESCRIPTION

It shall be understood that, the embodiments described herein are only intended to illustrate but not to limit the present disclosure.

Figure 1:
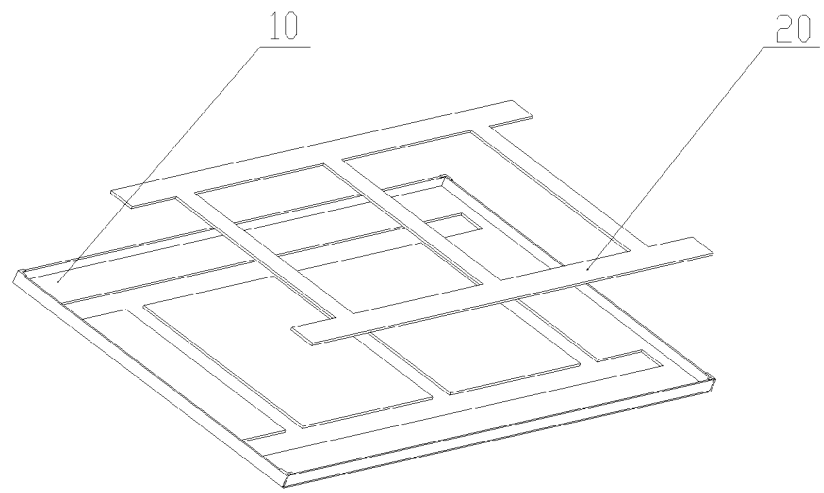
FIG. 1 is a schematic structural view of a first embodiment of a back cover of an LCD according to the present disclosure.

FIG. 1 is a schematic structural view illustrating a first embodiment of a back cover of an LCD according to the present disclosure. In this embodiment, the back cover of the LCD is used to support a backlight module, and is comprised of a back cover body 10 and an inset 20 inset into the back cover body 10.

The back cover is formed of a plastic material through injection molding or compression molding. Specifically, the inset 20 is put into a mold for the back cover body 10 in advance, and then the plastic material is injected into the mold to form an assembly of the back cover body 10 and the inset 20 with the inset 20 being inset into the back cover body 10. The inset 20 is made of a material having superior thermal conductivity and a certain mechanical strength such as a sheet metal, ceramic or a heat pipe; therefore, the inset 20 can impart a desirable strength and desirable flatness to the back cover of the LCD so as to ensure flatness of components of the backlight module. Meanwhile, because the inset 20 is made of a material having superior thermal conductivity, heat generated by the backlight source in the backlight module can be dissipated outwards through the inset 20.

In order for all components in the backlight module to be well fixed and to ensure flatness of the components of the backlight module, the inset 20 may be in the form of a hollow frame. As shown in FIG. 1, the inset 20 is designed to be an H-shaped structure in this embodiment. The inset 20 of this structure features high flatness and stability, so it can well ensure the strength and flatness of the back cover.

Figure 2:
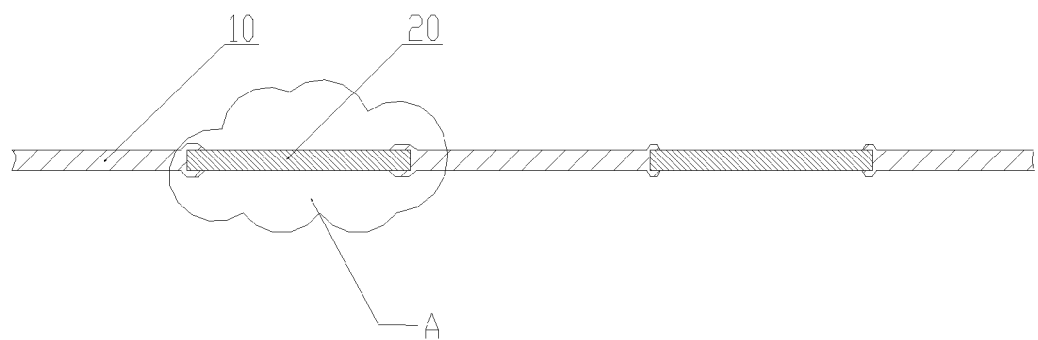
FIG. 2 is a schematic partial cross-sectional view of the first embodiment of the back cover of an LCD according to the present disclosure.

FIG. 2 is a schematic partial cross-sectional view illustrating the first embodiment of the back cover of an LCD according to the present disclosure. As shown, the inset 20 is fixedly covered by the back cover body 10. After the inset 20 is put into a mold for the back cover body 10, a plastic material is injected into the mold to form the back cover body 10 around a periphery of the inset 20. In this way, connecting portions between the inset 20 and the back cover body 10 can be covered by the back cover body 10 so as to fix the inset 20 into the back cover body 10. Of course, connection between the inset 20 and the back cover body 10 is not limited to this, but may also be achieved through adhesion or by means of screws.

Figure 3:
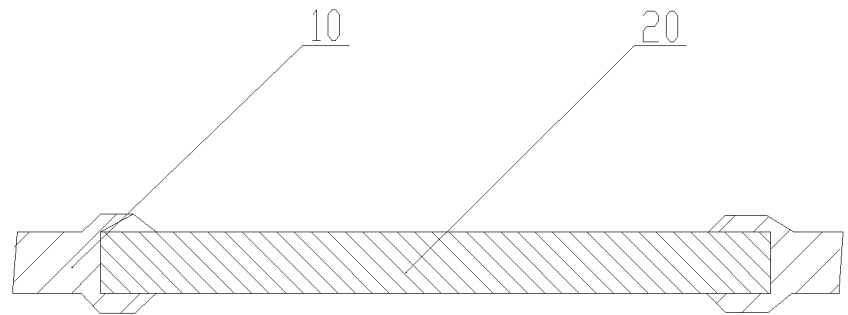
FIG. 3 is an enlarged view of a portion A shown in FIG. 2, which illustrates a form of connection between a back cover body and an inset.

FIG. 3 is an enlarged view of a portion A shown in FIG. 2, which illustrates a form of connection between the back cover body and the inset. An end of the inset 20 connected with the back cover body 10 is of a columnar form. The columnar end is connected to and fixedly covered by the back cover body 10.

Figure 4:
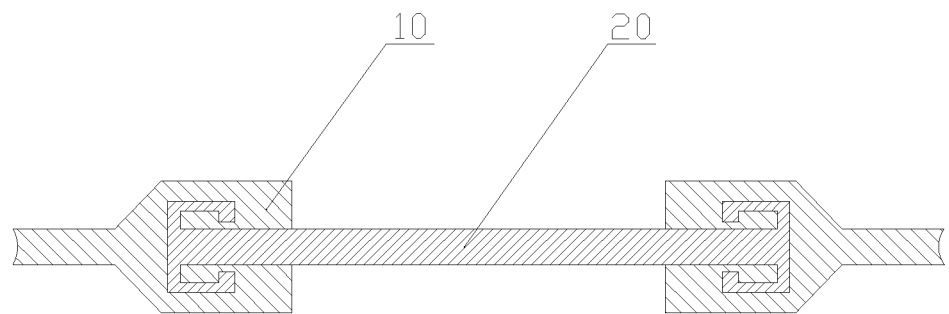
FIG. 4 is a schematic partial cross-sectional view of the first embodiment of the back cover of an LCD according to the present disclosure, which illustrates another form of connection between the back cover body and the inset.

FIG. 4 is a schematic partial cross-sectional view of the first embodiment of the back cover of an LCD according to the present disclosure, which illustrates another form of connection between the back cover body 10 and the inset 20. As shown in FIG. 4, the portion of the inset 20 connected with the back cover body 10 may also be designed as a structure having hook-shaped protrusions at the upper side and the lower side respectively, and is fixedly covered by the back cover body 10.

Figure 5:
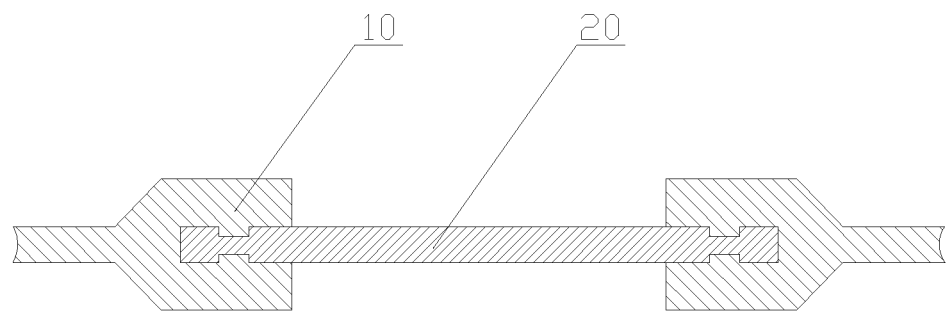
FIG. 5 is a schematic partial cross-sectional view of the first embodiment of the back cover of an LCD according to the present disclosure, which illustrates a further form of connection between the back cover body and the inset.

FIG. 5 is a schematic partial cross-sectional view of the first embodiment of the back cover of an LCD according to the present disclosure, which illustrates a further form of connection between the back cover body 10 and the inset 20. At locations near two ends thereof, the inset 20 is formed with recesses at the upper side and the lower side respectively, and after the inset 20 is connected with the back cover body 10, these locations will be fixedly covered by the back cover body 10.

With the structures of the inset 20 shown in FIG. 4 and FIG. 5, the inset 20 can be covered by the back cover body 10 in a larger area so that it is connected with the back cover body 10 more securely.

Figure 6:
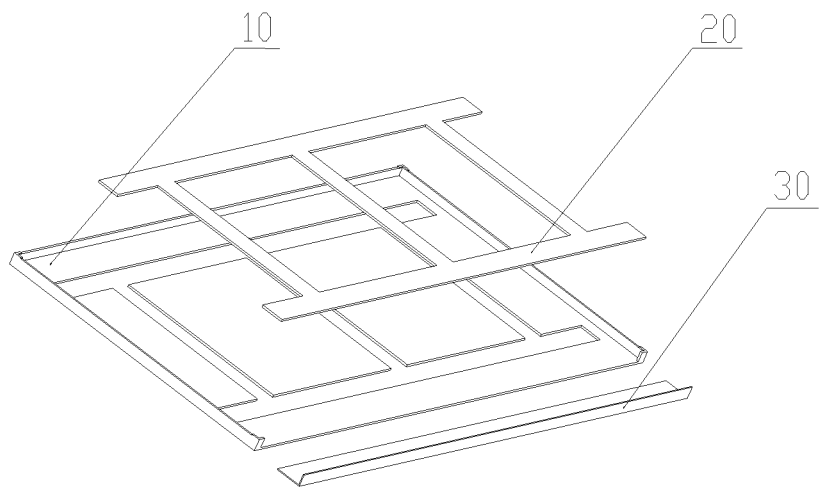
FIG. 6 is a schematic structural view of the first embodiment of the back cover of an LCD according to the present disclosure with a thermally conductive element being added.

Referring to FIG. 6, a further improvement on the first embodiment of the back cover of an LCD according to the present disclosure is shown therein. Here, the back cover of the LCD further comprises a thermally conductive element 30 fixed at a side of the back cover body 10. The thermally conductive element 30 is used to conduct heat generated by the backlight source in the backlight module so as to further improve the thermal conduction performance of the back cover of the LCD.

Figure 7:
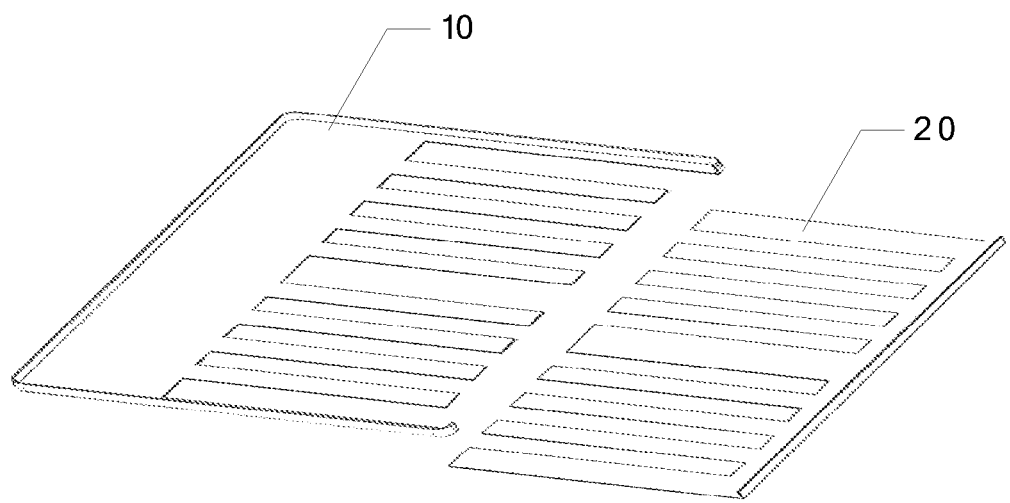
FIG. 7 is a schematic structural view of a second embodiment of a back cover of an LCD according to the present disclosure.

FIG. 7 shows a second preferred embodiment of the back cover of an LCD according to the present disclosure. The inset 20 is designed to be a dentation structure, and the back cover body 10 is also designed to be a dentation structure matching the dentation structure of the inset 20. In this way, in contrast to the practice of using a whole piece of sheet metal to form the back cover with a high material cost, forming the back cover from the inset 20 in combination with the back cover body 10 can significantly save the material cost. In addition, by designing the inset 20 in the form of a hollow frame, the material cost can be further reduced.

The present disclosure further provides a backlight module supported by the back cover. By using the back cover to support the whole backlight module, desirable flatness of components of the backlight module can be ensured. The back cover is formed of a plastic material through injection molding or compression molding; specifically, the inset 20 is put into a mold for the back cover body 10 in advance, and then the plastic material is injected into the mold to form the back cover with the inset 20 being inset in the back cover body 10. Meanwhile, the inset 20 also has desirable thermal conductivity, so heat generated by the backlight source in the backlight module can be dissipated outwards through the inset 20. The inset 20 is in the form of a hollow frame. The back cover body 10 of the LCD is used to support the whole backlight module so that all components of the backlight module can be fixed securely.

The present disclosure further discloses an LCD, which comprises a backlight module and a back cover for supporting the backlight module. The back cover is comprised of a back cover body 10 and an inset 20. The inset 20 is inset into the back cover body 10. The back cover of the LCD is formed by the inset 20 in combination with the back cover body 10 that is formed through injection molding, so it can not only ensure flatness of the components of the backlight module, but also provide desirable thermal conduction performance. Thereby, heat generated by the backlight source of the backlight module can be dissipated outwards.

What described above are only preferred embodiments of the present disclosure but are not intended to limit the scope of the present disclosure. Accordingly, any equivalent structural or process flow modifications that are made on basis of the specification and the attached drawings or any direct or indirect applications in other technical fields shall also fall within the scope of the present disclosure.

What is claimed is:

1. A back cover of a liquid crystal display (LCD) for supporting a backlight module, wherein the back cover comprises a back cover body and an inset, the inset is inset into the back cover body and is of a hollow frame structure, and the inset is a sheet metal inset, a ceramic inset or a heat pipe inset.

2. The back cover of an LCD of claim 1, wherein the inset is of an H-shaped or dentate structure.

3. The back cover of an LCD of claim 2, wherein the inset is fixedly covered by the back cover body.

4. The back cover of an LCD of claim 3, wherein the inset is fixed to the back cover body through adhesion or by means of screws.

5. The back cover of an LCD of claim 1, further comprising a thermally conductive element fixed at a side of the back cover body.

6. A backlight module supported by a back cover, wherein the back cover comprises a back cover body and an inset, the inset is inset into the back cover body and is of a hollow frame structure, and the inset is a sheet metal inset, a ceramic inset or a heat pipe inset.

7. The backlight module of claim 6, wherein the inset is of an H-shaped or dentate structure.

8. The backlight module of claim 7, wherein the inset is fixedly covered by the back cover body.

9. The backlight module of claim 8, wherein the inset is fixed to the back cover body through adhesion or by means of screws.

10. The backlight module of claim 6, wherein the back cover of the LCD further comprises a thermally conductive element fixed at a side of the back cover body.

11. An LCD, comprising a backlight module and a back cover for supporting the backlight module, wherein the back cover comprises a back cover body and an inset, the inset is inset into the back cover body and is of a hollow frame structure, and the inset is a sheet metal inset, a ceramic inset or a heat pipe inset.

12. The LCD of claim 11, wherein the inset is of an H-shaped or dentate structure.

13. The LCD of claim 12, wherein the inset is fixedly covered by the back cover body.

14. The LCD of claim 13, wherein the inset is fixed to the back cover body through adhesion or by means of screws.

15. The LCD of claim 11, wherein the back cover further comprises a thermally conductive element fixed at a side of the back cover body.

\* \* \* \* \*